US010070534B2

(12) United States Patent
Carini (10) Patent No.: US 10,070,534 B2
(45) Date of Patent: Sep. 4, 2018

(54) TOOL FOR CUTTING THE ISTHMUSES OF PRINTED CIRCUIT BOARDS

(71) Applicant: PIERGIACOMI SUD-S.R.L., Monteprandone (AP) (IT)

(72) Inventor: Andrea Carini, Castelfidaro (IT)

(73) Assignee: PIERGIACOMI SUD-S.R.L., Monteprandone (AP) (IT)

( * ) Notice: Subject to any disclaimer, the term of this patent is extended or adjusted under 35 U.S.C. 154(b) by 8 days.

(21) Appl. No.: 15/225,349

(22) Filed: Aug. 1, 2016

(65) Prior Publication Data
US 2018/0035547 A1 Feb. 1, 2018

(51) Int. Cl.
  B23Q 7/00 (2006.01)
  H05K 3/22 (2006.01)
  B23C 3/00 (2006.01)
  B23Q 11/00 (2006.01)

(52) U.S. Cl.
  CPC .......... *H05K 3/22* (2013.01); *B23C 3/00* (2013.01); *B23Q 11/0046* (2013.01); *B23Q 7/001* (2013.01); *H05K 2203/01* (2013.01); *Y10T 409/3056* (2015.01); *Y10T 409/304088* (2015.01)

(58) Field of Classification Search
  CPC . B23Q 7/00; B23Q 7/001; H05K 3/22; H05K 3/0044; H05K 3/0047; Y10T 409/3056; Y10T 409/303808; Y10T 409/304088; Y10T 409/305544; Y10T 409/307056; Y10T 409/309184; Y10T 409/30924; B27C 5/10
  See application file for complete search history.

(56) References Cited

U.S. PATENT DOCUMENTS

| | | | | |
|---|---|---|---|---|
| 1,771,764 A * | 7/1930 | Beattie | ............... | A61F 15/02 30/276 |
| 2,490,878 A * | 12/1949 | Marsh | ............... | A61F 15/02 30/276 |
| 3,384,085 A * | 5/1968 | Hall | ............... | A61B 17/1633 606/180 |
| 4,071,030 A * | 1/1978 | Hedrick | ............ | A61B 17/1695 30/276 |
| 4,572,714 A * | 2/1986 | Suzuki | ............... | B23B 51/02 407/53 |
| 4,830,554 A * | 5/1989 | Lopez | ............... | H05K 3/0052 29/414 |

(Continued)

*Primary Examiner* — Nicole N Ramos
(74) *Attorney, Agent, or Firm* — Egbert Law Offices, PLLC (57) ABSTRACT

A tool for cutting the isthmuses in slots of a plate comprising PCBs includes: a base plate, a spindle having a shank and a cutting tip, a spindle support fixed to the base plate and revolvingly supporting the spindle, a head fixed to the base plate and provided with a through hole wherein the shank of the spindle is disposed, a guide mounted on the head and provided with a through hole wherein the cutting tip of the spindle is disposed, in such manner that a portion of the cutting tip of the spindle protrudes from the guide, the guide having a guide rib disposed in alignment with the cutting tip of the spindle and suitable for being inserted into the holes of the plate comprising the PCBs to guide a relative movement of the plate comprising the PCBs with respect to the tool.

10 Claims, 7 Drawing Sheets

(56) References Cited

U.S. PATENT DOCUMENTS

| | | | | |
|---|---|---|---|---|
| 5,275,517 A | * | 1/1994 | Turnipseed | B23B 39/003 144/135.2 |
| 5,894,648 A | * | 4/1999 | Hill | H05K 3/0052 29/33 P |
| 6,558,394 B2 | * | 5/2003 | Lee | A61F 13/04 30/390 |

* cited by examiner

TOOL FOR CUTTING THE ISTHMUSES OF PRINTED CIRCUIT BOARDS

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present patent application for industrial invention relates to a tool for cutting the isthmuses of printed circuit boards (PCBs).

2. Description of Related Art Including Information Disclosed Under 37 CFR 1.97 and 37 CFR 1.98

As it is known, large plates comprising a plurality of PCBs connected by bridges of material called "isthmuses" are generally produced in the electronics industry.

Consequently, the isthmuses need to be cut in order to remove the PCBs from the initial plate.

Generally, the isthmuses are cut manually with ordinary cutting tools. Evidently, such a manual cut is not precise, it takes a long time and it requires a certain skill on the operator's side in order not to damage the printed circuit boards.

In order to solve the drawbacks of manual cutting at least partially, the use of a template is known, which reproduces the edges of the printed circuit boards in order to guide the cutting tool when cutting the isthmuses. However, the making of the template adds an additional complexity to the cutting process.

In order to avoid making a template, a milling cutter is commonly mounted on a CNC machine to cut the isthmuses of the PCBSs. In such a case it is necessary to provide the automatic machine with the dimensions of the PCBs and the coordinates of the isthmuses. Therefore, the cutting process with an automatic machine is expensive because it requires a CNC machine and complex because the dimensions and coordinates must be provided to the CNC machine.

The purpose of the present invention is to eliminate the drawbacks of the prior art by devising a tool used for cutting the isthmuses of printed circuit boards, which is precise, reliable, practical, versatile, inexpensive, and simple to make and use.

BRIEF SUMMARY OF THE INVENTION

These purposes are achieved according to the invention with the characteristics of the independent claim 1.

Advantageous embodiments will appear from the dependent claims.

The tool of the invention is used to cut the isthmuses of printed circuit boards (PCBs). The isthmuses are bridges of material disposed in slots of a plate comprising a plurality of PCBs.

The tool of the invention comprises:
- a base plate,
- a spindle comprising a shank intended to be fixed to a rotating machine and a cutting tip intended to be inserted into said slots of the plate comprising the PCBs and to cut said isthmuses,
- a spindle support fixed to said base plate and revolvingly supporting said spindle,
- a head fixed to said base plate and provided with a through hole wherein said shank of the spindle is disposed,
- a guide mounted on said head and provided with a through hole wherein said cutting tip of the spindle is disposed, in such manner that a portion of the cutting tip of the spindle protrudes from the guide.

The guide comprises a guide rib that is aligned with the cutting tip of the spindle and is intended to be inserted into said slots of the plate comprising the PCBs to guide a relative movement of the plate comprising the PCBs with respect to the device.

The advantages of the tool according to the invention are evident because it provides for a reliable, simple and practical way to cut the isthmuses without using templates or CNC machines.

BRIEF DESCRIPTION OF THE SEVERAL VIEWS OF THE DRAWINGS

Additional features of the invention will appear clearer from the detailed description below, which refers to merely illustrative, not limiting embodiments, wherein.

DETAILED DESCRIPTION OF THE INVENTION

With reference to the Figures, the tool for cutting isthmuses of PCBs according to the invention is disclosed, which is generally indicated with reference numeral (1).

Figure 1:
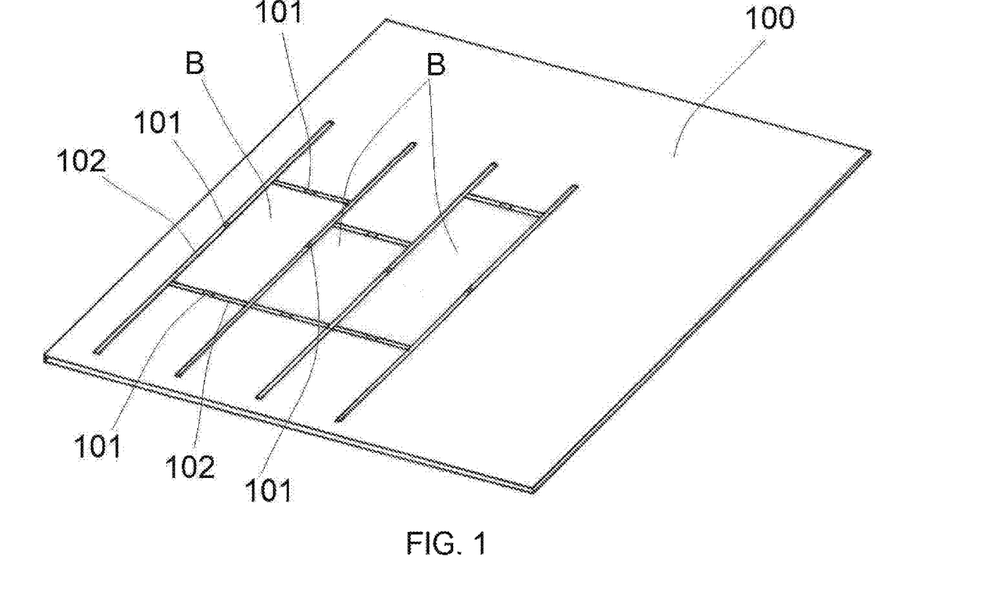
FIG. 1 is a diagrammatic perspective view of a plate comprising a plurality of PCBs connected with isthmuses.

FIG. 1 shows a plate (100) comprising a plurality of PCBs (B) that are connected mutually and/or to the plate (100) by means of isthmuses (101) composed of bridges.

The plate (100) and the isthmuses (101) are made of the same material as the PCB (B). Also with reference to FIG.

3A, the isthmuses (101) are disposed in slots (102) defined between the borders of the PCBs. Said slots (102) generally have a width of approximately 1-3 mm.

With reference to FIGS. 2-4-6, the tool (1) comprises a base plate (2) shaped as a rectangular plate. A vise (3) is disposed under the base plate (2) to fix the tool (1) to a fixed frame.

Figure 4:
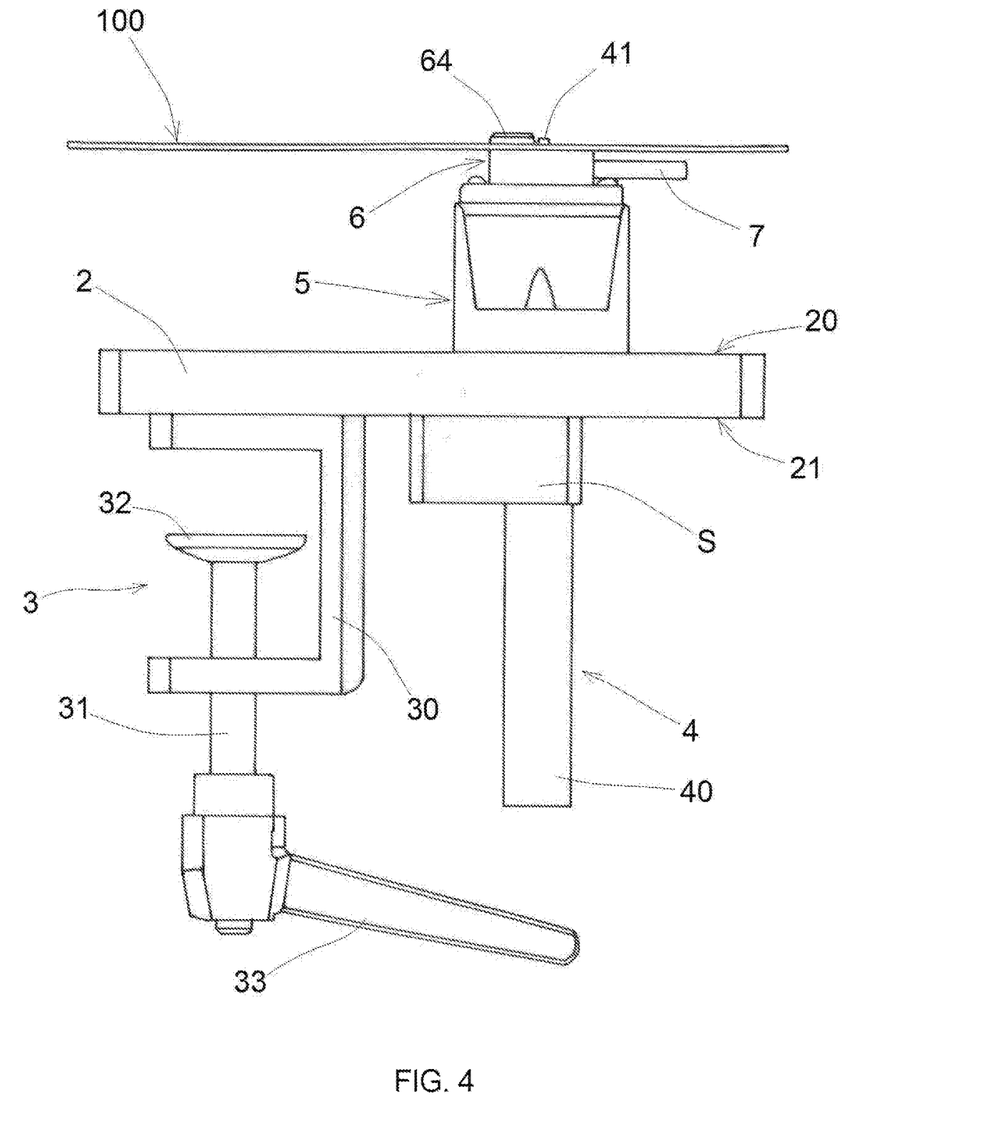
FIG. 4 is a side view of the tool of FIG. 3.
Figure 5:
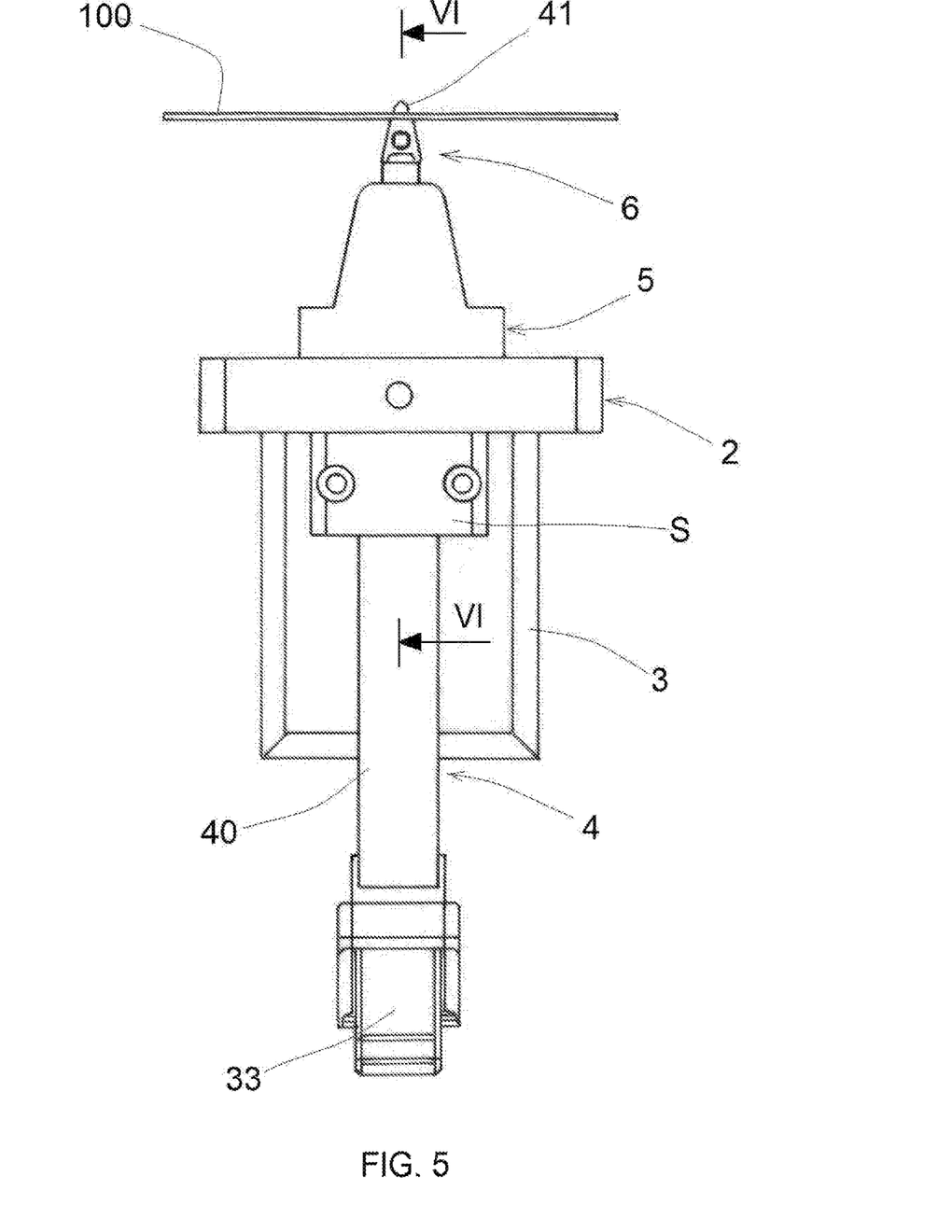
FIG. 5 is a side view of the tool of FIG. 3.

With reference to FIG. 4, the base plate (2) comprises an upper surface (20) and a lower surface (21). The vise (3) comprises a fixing support (30) with "C"-shaped section that is fixed to the lower surface (21) of the base plate and a threaded stem (31) that is screwed in the fixing support (30). The threaded stem (31) comprises a jaw (32) to tighten a fixed frame and a crank (33) for manual actuation.

Figure 6:
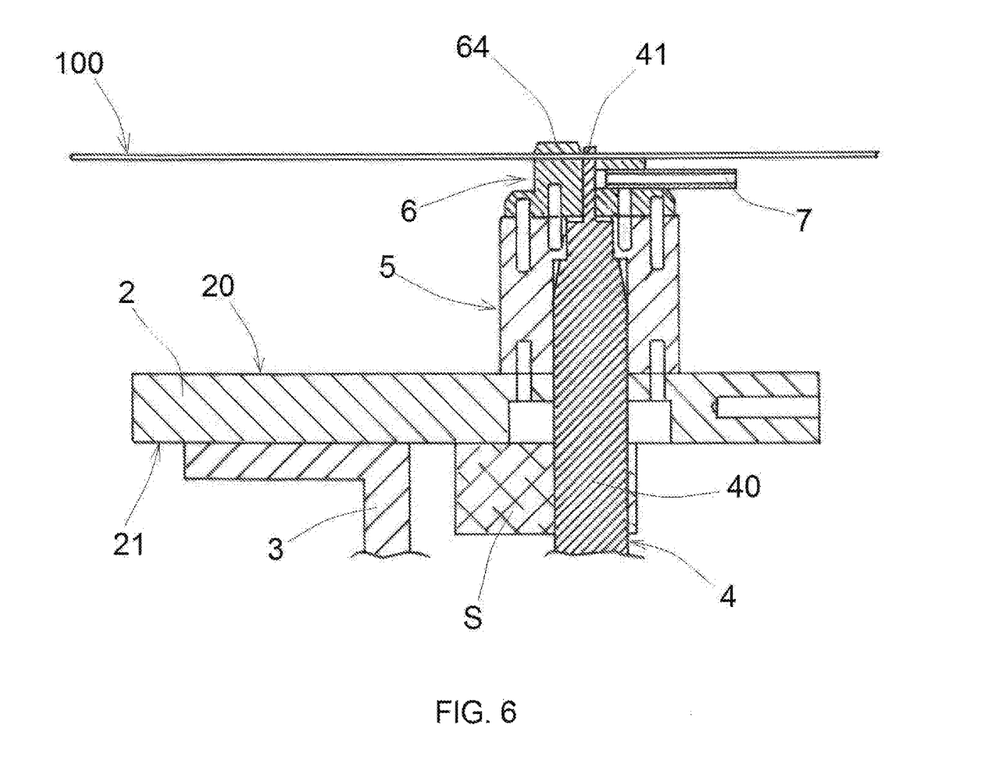
FIG. 6 is a sectional view taken along the sectional plane VI-VI of FIG. 5.
Figure 7:
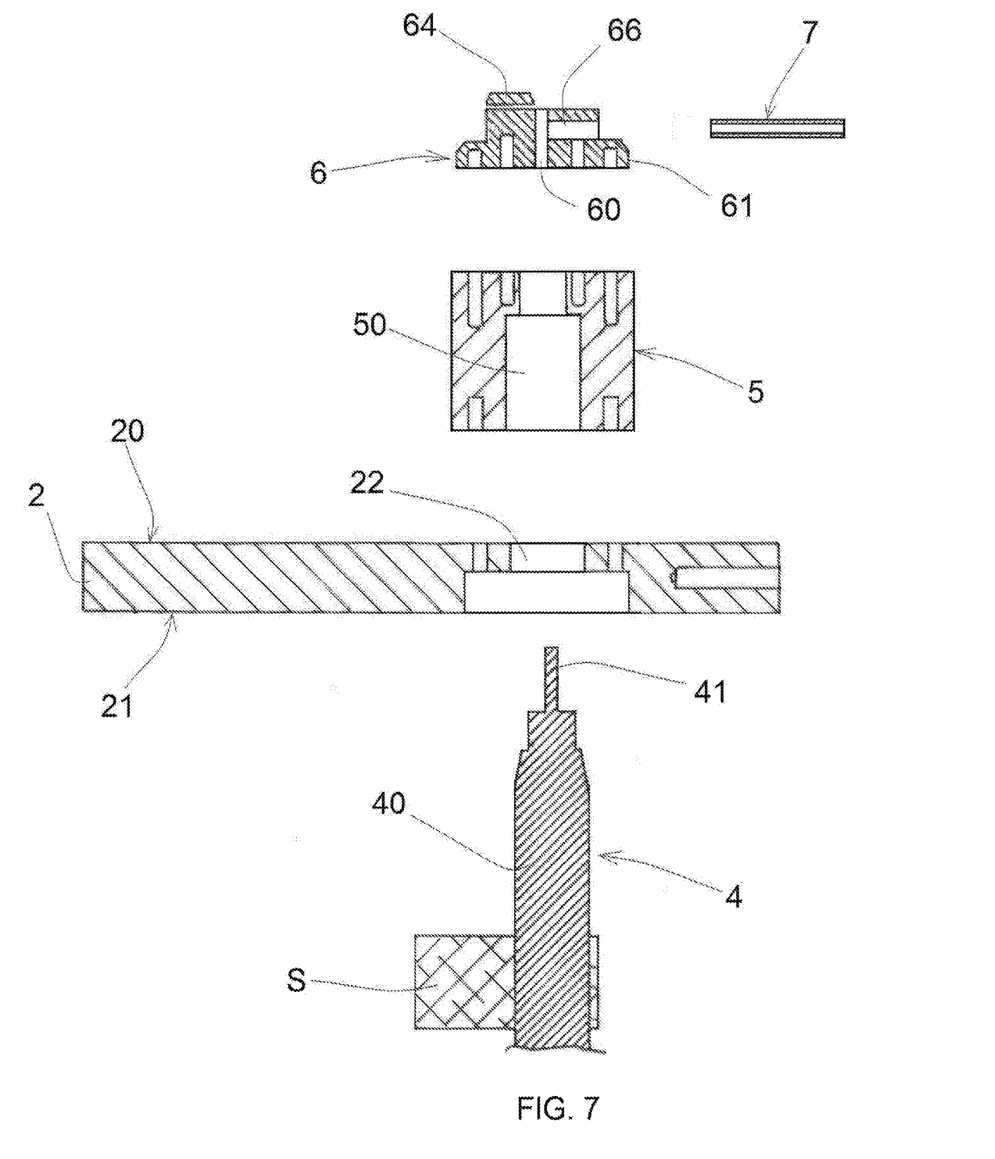
FIG. 7 is an exploded sectional view of some elements of the device according to the invention.

A spindle (4) is revolvingly mounted in a spindle support (S) that is fixed to the lower surface (21) of the base plate. The spindle (4) has an axis of rotation that is orthogonal to the base plate (2). With reference to FIGS. 6 and 7, the spindle (4) comprises a shank (40) and a cutting tip (41) that protrudes in upper position from the shank (40) and has a smaller diameter than the shank (40).

In view of the above, the shank (40) of the spindle protrudes in lower position from the base plate (2) in order to be connected to a rotating machine (not shown in the Figures) that generates the rotation of the spindle (4).

With reference to FIGS. 6 and 7, the base plate (2) comprises a through hole (22), wherein the shank (40) of the spindle is inserted in such manner to protrude in upper position from the base plate.

A head (5) is fixed on the upper surface (20) of the base plate. The head (5) has a through hole (50) intended to be put in register with the through hole (22) of the base plate. So the shank (40) of the spindle is inserted into the through hole (50) of the head in such a way that the cutting tip (41) of the spindle protrudes in upper position from the head (5).

A guide (6) is mounted on the head (5). Advantageously, the guide (6) is removably mounted on the head (5) in such a way that the guide (6) is interchangeable.

The guide (6) comprises a through hole (60) wherein the cutting tip (41) of the spindle is inserted, so that a portion of the tip of the spindle protrudes in upper position from the guide (6).

Figures 2, 2A:
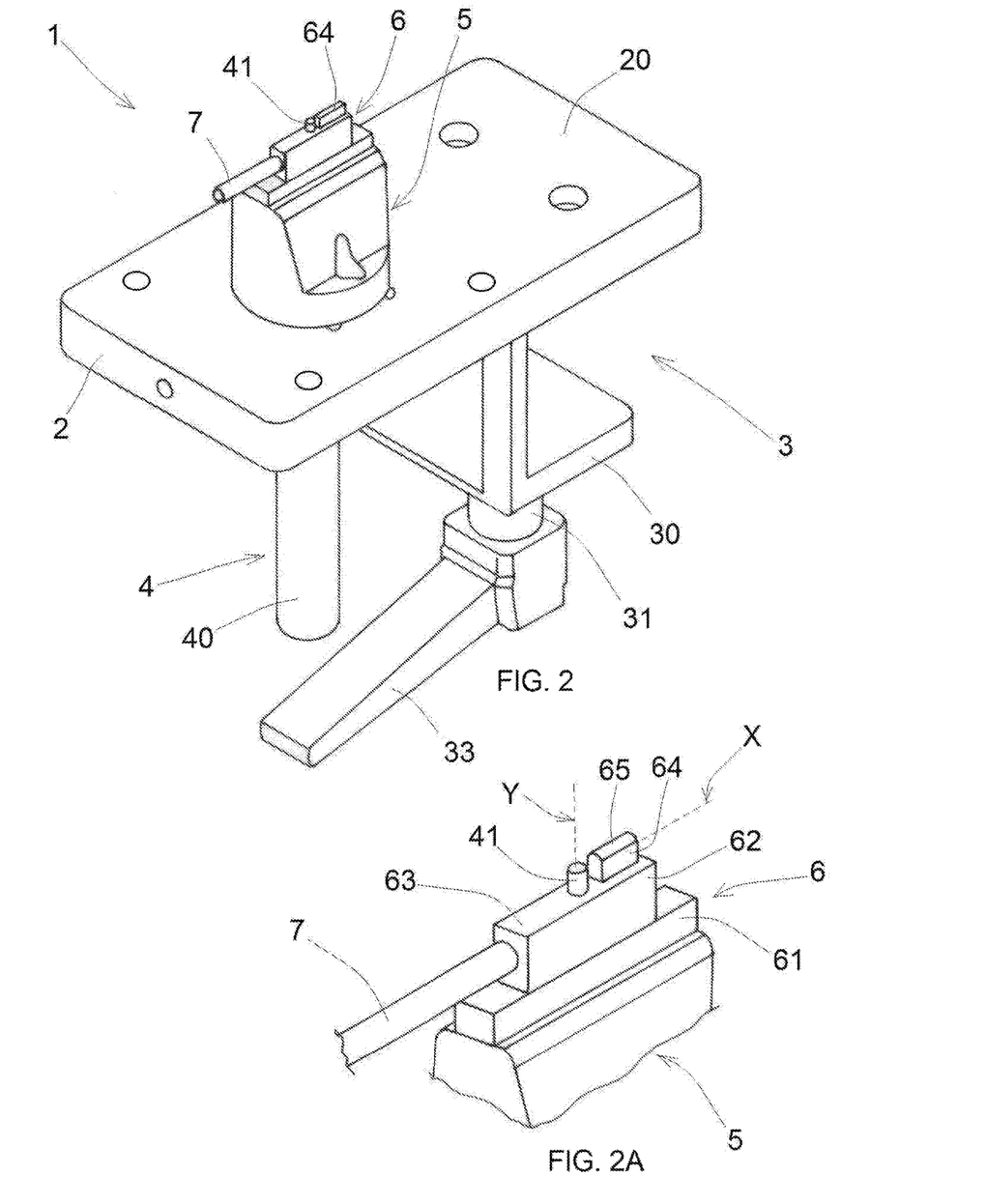
FIG. 2 is a perspective view of a tool for cutting the isthmuses of PCBs according to the invention.
FIG. 2A is an enlarged view of a portion of the tool of FIG. 2.

With reference to FIG. 2A, the guide (6) comprises:
a base body (61) fixed to the head (5),
a support block (62) disposed on the base body, and
a guide rib (64) disposed on the support block (62).

The support block (62) has an upper flat planar surface (63) to support the plate (100) comprising the PCBs.

The cutting tip (41) of the spindle protrudes in upper position from the upper surface (63) of the support block. The guide rib (64) is aligned with the tip of the spindle. Namely, the guide rib (64) has a longitudinal axis (X) that intersects the vertical axis (Y) of rotation of the cutting tip (41) of the spindle (41).

The guide rib (64) has a slightly lower width than the slots (102) of the plate (100) comprising the PCBs. Therefore the guide rib (64) has a width comprised between 1 and 3 mm. The guide rib has a length of approximately 8-12 mm.

The guide rib has a tapered upper portion (65) with decreasing dimensions going upwards in order to facilitate the insertion of the guide rib in the slots (102) of the plate (10) comprising the PCBs.

The cutting tip (41) of the spindle has a diameter equal to the width of the guide rib (64).

Figure 2B:
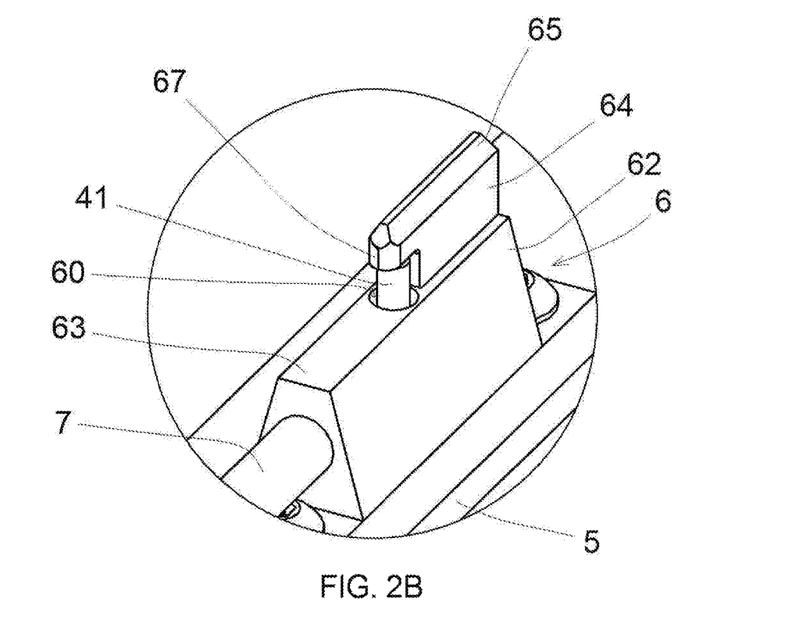
FIG. 2B is the same view as FIG. A, except in that it illustrates a variant of the guide of the tool according to the invention.

With reference to FIG. 2B, according to a preferred embodiment, the guide rib (64) has a projection (67) that overhangs above the tip (41) of the spindle. In such a way the tool (1) is put in safety mode to prevent users from hurting themselves with the cutting tip (41) of the spindle.

With reference to FIG. 7, the guide (6) comprises a suction hole (66) in communication with the through hole (60) that receives the cutting tip (41) of the spindle. A suction duct (7) is disposed in the suction hole (66) and is intended to be connected to a suction pump (not shown in the figures) to suck the waste material produced when cutting the isthmuses (101).

Figure 3:
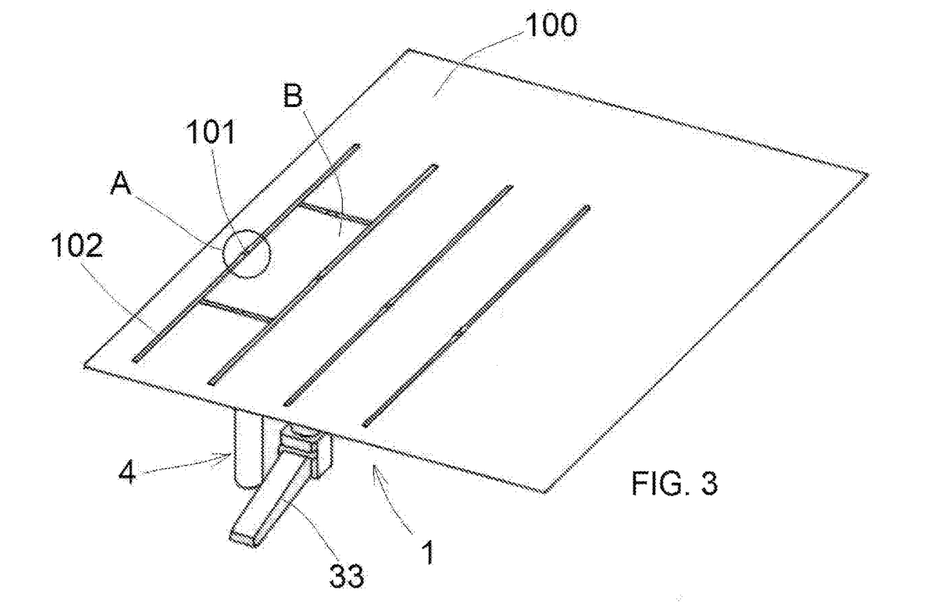
FIG. 3 is a perspective view of the tool of FIG. 2 whereon the plate of FIG. 1 is disposed.
Figure 3A:
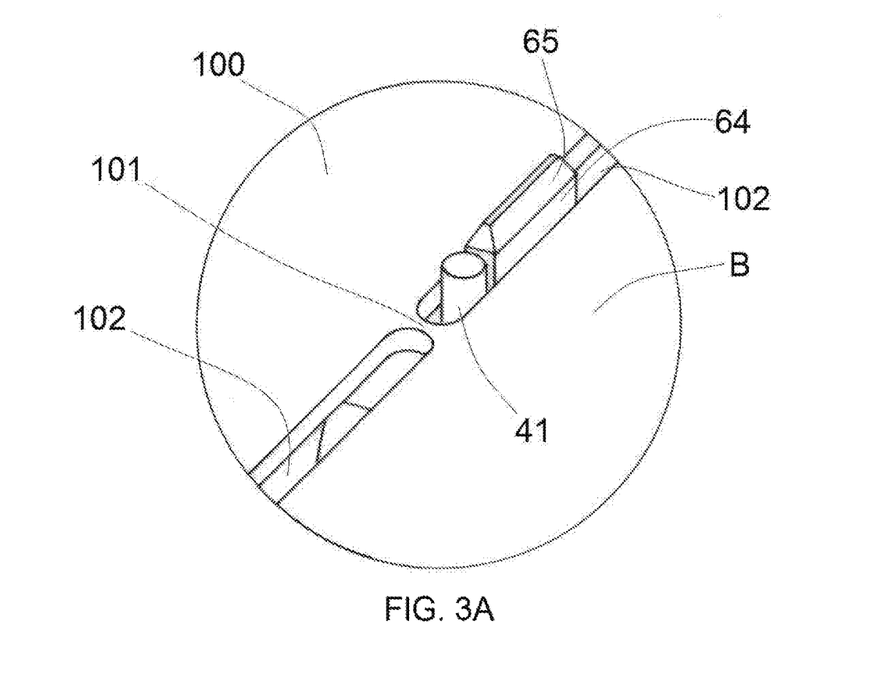
FIG. 3A is an enlarged detail contained in the circle (A) of FIG. 3.

FIGS. 3 and 3A illustrate the plate (100) comprising the PCBs (B) disposed on the upper surface (63) of the support block of the guide. The guide rib (64) and the cutting tip (41) are inserted into the slot (102) of the guide rib. The tool (1) is fixed to a fixed support by means of the vise (3). The spindle (4) is driven into rotation. The plate (100) comprising the PCBs is moved freely along the direction of the slot (102) guided by the guide rib (64). Consequently, the rotary cutting tip (41) comes in contact with the isthmus (101) and cuts the isthmus (101).

Although the figures illustrate an embodiment wherein the tool (1) is fixed and the plate (100) comprising the PCBs (B) is mobile with respect to the device, the vice (3) of the tool is optional and the tool (1) can move with respect to the plate (100) comprising the PCBs (B). In any case the relative movement of the tool (1) with respect to the plate (100) is guided by the guide rib (64) that slides on the slot (102) of the plate (100) comprising the PCBs (B).

The peculiar characteristics of the invention are represented by the interchangeable guide (6) that is crossed by the cutting tip (41) of the spindle. The other elements of the tool (1), such as the base plate (2), the spindle support (S), the head (5), and the vice (3) with the knob (33) are of known type or in any case optional.

Numerous variations and modifications can be made to the present embodiments of the invention, which are within the reach of an expert of the field, falling in any case within the scope of the invention as disclosed by the attached claims.

I claim:

1. A tool for cutting isthmuses of printed circuit boards, wherein the isthmuses are bridges of material disposed in slots of a plate having a plurality of PCBs, the tool comprising:
a base plate with an upper surface and a lower surface;
a spindle having a shank affixable to a rotating machine and a cutting tip insertable into the slots of the plate having the plurality of PCBs and to cut the isthmuses;
a spindle support fixed to said base plate and revolvingly supporting said spindle;
a head fixed to said base plate and having a through hole in which said shank of the spindle is disposed; and
a guide mounted on said head and having a through hole in which said cutting tip of the spindle is disposed; in such manner that a portion of the cutting tip of the spindle protrudes from the guide, said guide comprising a guide rib aligned with the cutting tip of the spindle and insertable into the slots of the plate with the plurality of PCBs in order to guide a relative movement of the plate with the PCBs with respect to the tool wherein the plate with the plurality of PCBs is freely movable from a top position to a bottom position and from the bottom position to the top position so that the guide rib of said guide enters into the slot of the plate having the plurality of PCBs and the guide rib of the guide exits from the slot of the plate having the plurality of PCBs in order to rotate the plate having the plurality of PCBs.

2. The tool of claim 1, wherein said guide rib has a longitudinal axis that intersects an axis of the cutting tip coinciding with an axis of rotation of the spindle.

3. The tool of claim 1, wherein said guide rib has a width of between 1 mm and 3 mm and a length of between 8 mm and 12 mm.

4. The tool of claim 1, wherein said guide rib has a tapered upper portion with decreasing dimensions.

5. The tool of claim 1, wherein said guide is removably mounted on the head.

6. The tool of claim 1, wherein said guide comprises a support block with an upper flat planar surface that supports said plate with the plurality of PCBs.

7. The tool of claim 1, wherein said guide comprises a suction hole in communication with the through hole that receives the cutting tip of the spindle so as to suck the waste material produced when cutting the isthmuses.

8. The tool of claim 7, said guide further comprising a suction duct disposed in said suction hole and connectable to a suction pump.

9. The tool of claim 1, further comprising a vise fixed to the base plate and fixable to a fixed frame.

10. The tool of claim 1, wherein said guide rib comprises a projection that overhangs above the cutting tip of the spindle.

\* \* \* \* \*